(12) United States Patent  (10) Patent No.: US 8,415,828 B2
Johnson, Jr. et al. (45) Date of Patent: Apr. 9, 2013

(54) POWER SUPPLY LOADING INDICATORS AND METHODS

(75) Inventors: Robert W. Johnson, Jr., Raleigh, NC (US); Dinesh Shah, San Diego, CA (US)

(73) Assignee: Eaton Corporation, Cleveland, OH (US)

( * ) Notice: Subject to any disclaimer, the term of this patent is extended or adjusted under 35 U.S.C. 154(b) by 2280 days.

(21) Appl. No.: 10/790,604

(22) Filed: Mar. 1, 2004

(65) Prior Publication Data

US 2005/0189817 A1 Sep. 1, 2005

(51) Int. Cl.
*H02J 3/14* (2006.01)
(52) U.S. Cl. .............................. 307/32; 307/66
(58) Field of Classification Search ............. 307/43, 307/66, 32
See application file for complete search history.

(56) References Cited

U.S. PATENT DOCUMENTS

| | | | |
|---|---|---|---|
| 3,683,198 A | 8/1972 | Thode | |
| 4,775,828 A * | 10/1988 | Watley et al. | 322/7 |
| 4,884,809 A * | 12/1989 | Rowan | 463/47.3 |
| 5,534,734 A | 7/1996 | Pugh et al. | |
| 5,616,968 A * | 4/1997 | Fujii et al. | 307/66 |
| 5,962,932 A | 10/1999 | Matlo | |
| 6,320,585 B1 * | 11/2001 | Engel et al. | 345/440 |
| 6,593,723 B1 | 7/2003 | Johnson | |
| 6,678,268 B1 * | 1/2004 | Francis et al. | 370/380 |
| 6,826,036 B2 * | 11/2004 | Pereira | 361/624 |
| 7,043,543 B2 * | 5/2006 | Ewing et al. | 709/223 |
| 7,181,630 B2 * | 2/2007 | Kadoi et al. | 713/300 |
| 2001/0024109 A1 * | 9/2001 | Sobkow et al. | 323/225 |
| 2003/0121689 A1 * | 7/2003 | Rasmussen et al. | 174/50 |

FOREIGN PATENT DOCUMENTS

| | | |
|---|---|---|
| JP | 09131073 | 5/1997 |
| SU | 1 396 075 A1 | 5/1988 |
| WO | WO 01/53846 A1 | 7/2001 |

OTHER PUBLICATIONS

V Series, Single Phase North American, Vertical Power Distribution Unit, Pulizzi Engineering, Inc., 2003, 4 pages.
Powerware® 5125, Two-in-One User's Guide, 2400-3000 VA, 2002, 58 pages.
International Search Report for International patent application No. PCT/US2005/005633 mailed on Aug. 9, 2006.
Invitation to Pay Additional Fees and Partial International Search Report for International patent application No. PCT/US2005/005633 mailed on Jun. 28, 2005.
European Office Action Corresponding to European Application No. 05 713 945.3; Dated: Apr. 25, 2012; 5 Pages.

* cited by examiner

*Primary Examiner* — Robert L. Deberadinis
(74) *Attorney, Agent, or Firm* — Myers Bigel Sibley & Sajovec, P.A.

(57) ABSTRACT

Apparatus includes a segment loading indicator configured to be electrically coupled to a load segment output of a power supply, such as a UPS, and operative to provide an indication of a loading of the load segment output. For example, the segment loading indicator may be operative to provide an indication of a loading of the load segment output with respect to load rating of the load segment output. A UPS may include a loading indicator is coupled to a power output and operative to provide rear-panel indication of a loading of the power output.

35 Claims, 6 Drawing Sheets

POWER SUPPLY LOADING INDICATORS AND METHODS

BACKGROUND OF THE INVENTION

The present invention relates to power supplies, and more particularly, to monitoring of power supplies.

A conventional power supply, such as an uninterruptible power supply (UPS) used to provide AC and/or DC power for computer, communications, or other equipment, may include some way of indicating to an operator the level of loading of the power supply. For example, the Powerware® 5125 rack-mounted UPS includes a bank of light-emitting diodes (LEDs) mounted on its front panel that provide load level indication, i.e., the percentage of rated load currently being served by the UPS. Other conventional UPSs may include an LED or other indicator that shows when the UPS is overloaded. Some conventional power strips also include some type of indicator for indicating loading of the strip.

SUMMARY OF THE INVENTION

Some embodiments of the present invention arise from a realization that improved power distribution monitoring may be provided by providing respective segment loading indicators for respective load segment outputs of a power supply, such as a UPS. According to further aspects of the invention, a loading indicator may be provided on a rear panel of a power supply, such as a rack-mountable UPS, such that loading of an output of the power supply can be determined without reference to a front panel display. Such rear-panel indicators may be provided for respective load segment outputs of the power supply.

In particular, according to some embodiments of the invention, an apparatus comprises a plurality of segment loading indicators configured to be electrically coupled to respective load segment outputs of a power supply, such as a UPS. Each of the segment loading indicators is operative to provide an indication, e.g., a visual indication, of a loading of the associated load segment output. At least one of the segment loading indicators may be operative to provide an indication of a loading of the associated load segment output with respect to load rating of the associated load segment output. In some embodiments, at least one of the segment loading indicators is operative to provide an indication of a loading of the associated load segment output with respect to a load rating of a circuit protection device that protects the associated load segment output. The plurality of segment loading indicators may be integrated in the power supply and/or in a power distribution device configured to be connected to the power supply and including the load segment outputs.

In further embodiments of the invention, a UPS includes a housing having first and second panels, e.g., front and rear panels. The UPS further includes a power output at the second panel of the housing and uninterruptible power supply circuitry supported by the housing and operative to generate a voltage at the power output. The UPS also includes a user interface positioned at the first panel of the housing and operatively associated with the uninterruptible power supply circuitry. A loading indicator is coupled to the power output and is operative to provide a visual indication at the second panel of the housing of a loading of the power output. The power output may include a plurality of load segment outputs, and the loading indicator may comprise a plurality of segment loading indicators, respective ones of which are operative to provide respective visual indications of loadings of the respective load segment outputs with respect to load ratings of the load segment outputs.

In still further embodiments of the invention, a UPS includes a plurality of load segment outputs and uninterruptible power supply circuitry operative to provide power at the load segment outputs. The UPS also include respective segment loading indicators coupled to the respective load segment outputs and operative to provide respective indications of loadings of the respective load segment outputs. Related methods are also described.

DETAILED DESCRIPTION

Figure 1:
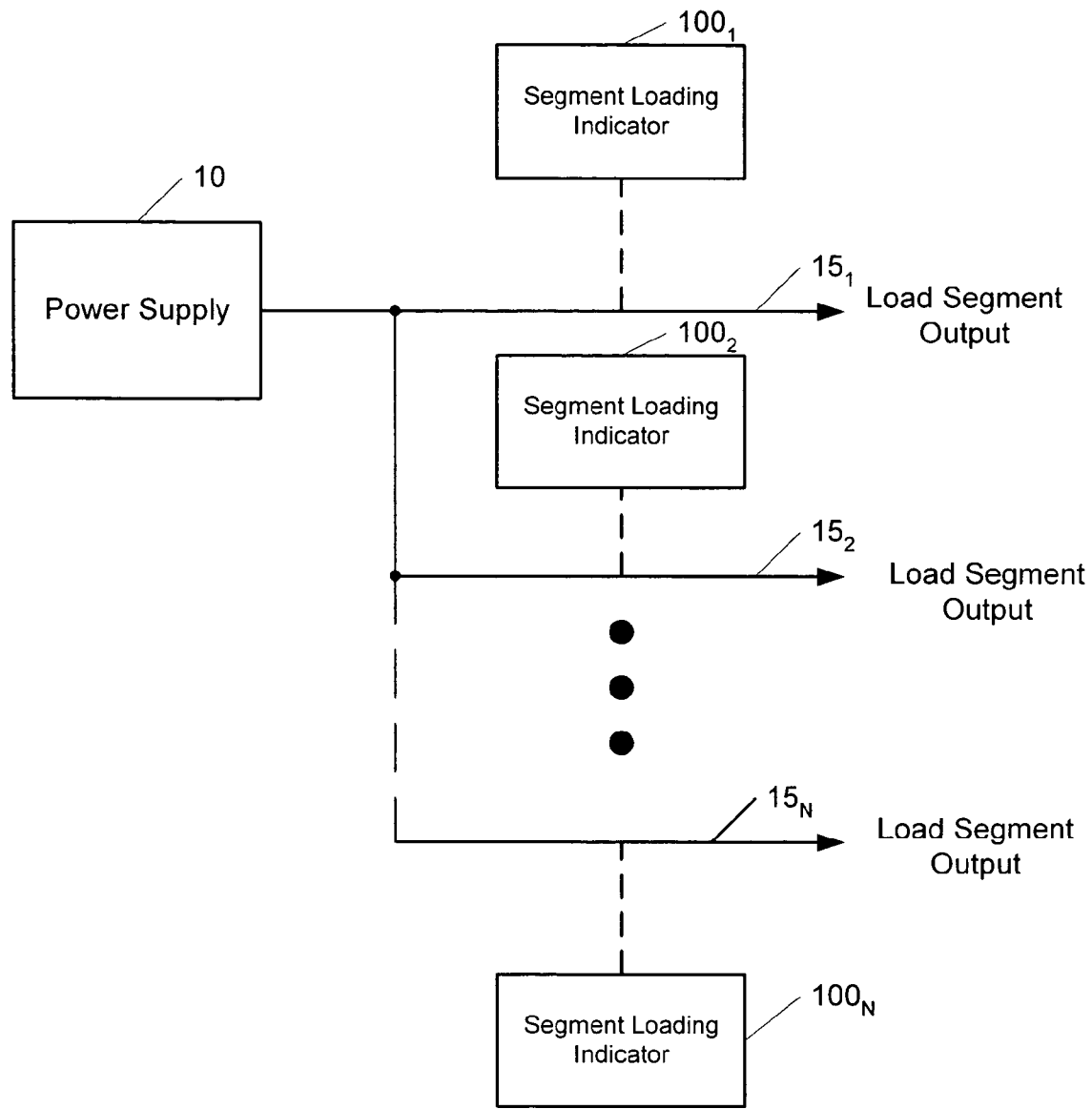
FIG. 1 illustrates a segment loading indicator apparatus according to some embodiments of the invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present.

FIG. 1 illustrates use of respective segment loading indicators $100_1$-$100_N$ to monitor loading of respective load segment outputs $15_1$-$15_N$ that serve respective load segments attached to an output of a power supply 10, according to some embodiments of the present invention. It will be appreciated that, although exemplary embodiments described herein relate to UPS applications, the invention may be used with any of a number of different types of power supplies, including, but not limited to, AC power supplies, DC power supplies, UPSs that provide AC and/or DC power, generators, fuel cells, and the like. It will be further understood that load segment load indication may be provided using any of a number of different types of indications provided by any of a number of different types of indicator devices, including, but not limited to, visual indications provided by devices such as LEDs, lamps, or liquid crystal displays (LCDs), and/or audible indications provided by tone generators or other audio devices.

Figure 2:
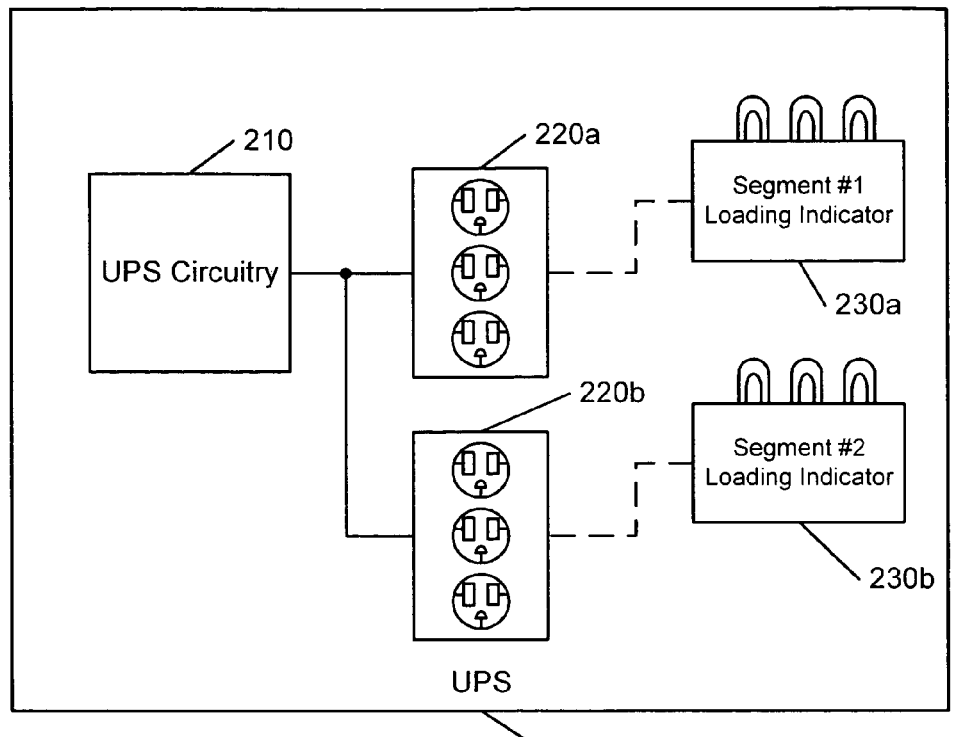
FIG. 2 illustrates segment loading indicators for a UPS according to further embodiments of the invention.

FIG. 2 illustrates an exemplary embodiment of the present invention in a UPS 200. The UPS 200 includes UPS circuitry 210, such as power conversion circuitry, transfer switch circuitry and associated control circuitry, that provides power to first and second load segment outputs 220a, 220b. First and second segment loading indicators 230a, 230b are coupled to respective ones of the load segment outputs 220a, 220b and provide indication of the loading thereof. For example, the segment loading indicators 230a, 230b may provide visual indication of the relative loading of the load segment outputs 220b, 220c with respect to a load rating thereof.

Such indication may comprise, for example, an indication as to when loading of the segment exceeds some predetermined maximum, for example, by illuminating an LED or lamp to indicate the presence of an overload. In further embodiments, the loading indication may be of a relative loading (e.g., a percentage) of the segment with respect to a predetermined maximum. For example, a plurality of lamps or LEDs may be provided, illumination of which provide indication of respective loading levels for the load segment output. Such an indication may be particularly advantageous in applications in which it is desired to balance loading among load segments. For example, in some embodiments, a first LED may indicate a first loading level (e.g., 25%), a second LED may indicate a second loading level (e.g., 50%), a third LED may indicate a fourth loading level (e.g., 75%) and fourth LED may indicate an overload (e.g., 100% or greater). In other embodiments, multiple LEDs could be replaced by an LED capable of producing different color displays for respective loading levels, or a display device that produces a bar graph or other display format suited for indicating relative loading. In still other embodiments, an electromechanical device, such as a meter movement, may be used to provide a visual indication of loading.

Figure 3:
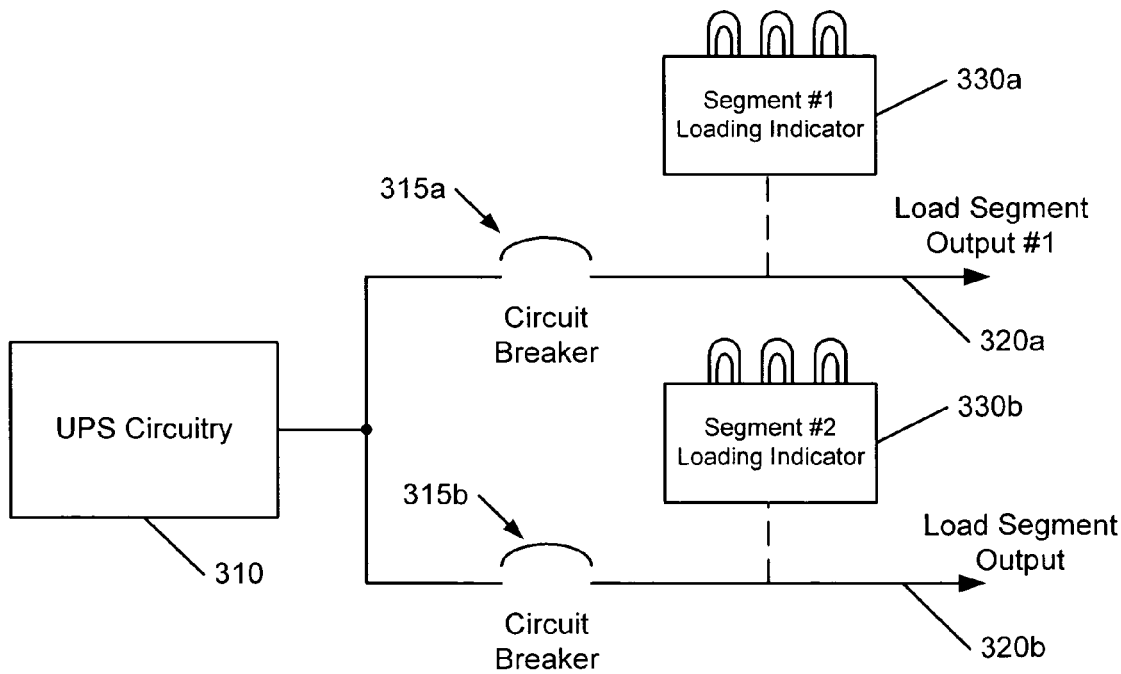
FIG. 3 illustrates segment loading indicators for indication loading of circuit protection devices according to some embodiments of the invention.

FIG. 3 illustrates segment loading indication according to further exemplary embodiments of the invention. UPS circuitry 310 provides power to first and second load segment outputs 320a, 320b that are protected by respective circuit protection devices, here shown as circuit breakers 315a, 315b. First and second segment loading indicators 330a, 330b are configured to be coupled to the respect segment load outputs 320a, 320b. Each is operative to provide an indication of loading of the load segment output 320a, 320b to which it is coupled with respect to a load rating of the associated protective device 315a, 315b. Such an approach may be particularly advantageous, for example, in applications in which one or more UPSs are used to provide power to a power distribution unit (PDU), load panel, or similar multi-segment power distribution device that includes integral circuit protection devices (e.g., circuit breakers) for protecting branch circuits. For example, in rack-mounted UPS applications in which multiple UPSs are connected in parallel to provide power to a PDU, such an arrangement may provide information that can prevent overloading of particular branches that generally would not be provided by individual load level indicators on the individual UPSs.

Figure 4A:
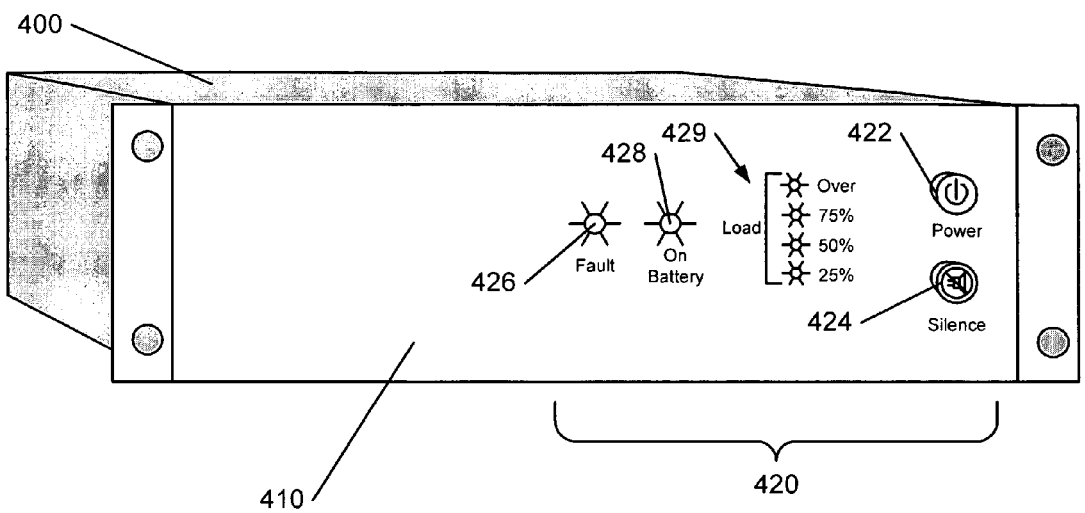
FIGS. 4A, 4B and 5 illustrate UPSs with rear-panel loading indicators according to further embodiments of the invention.
Figure 4B:
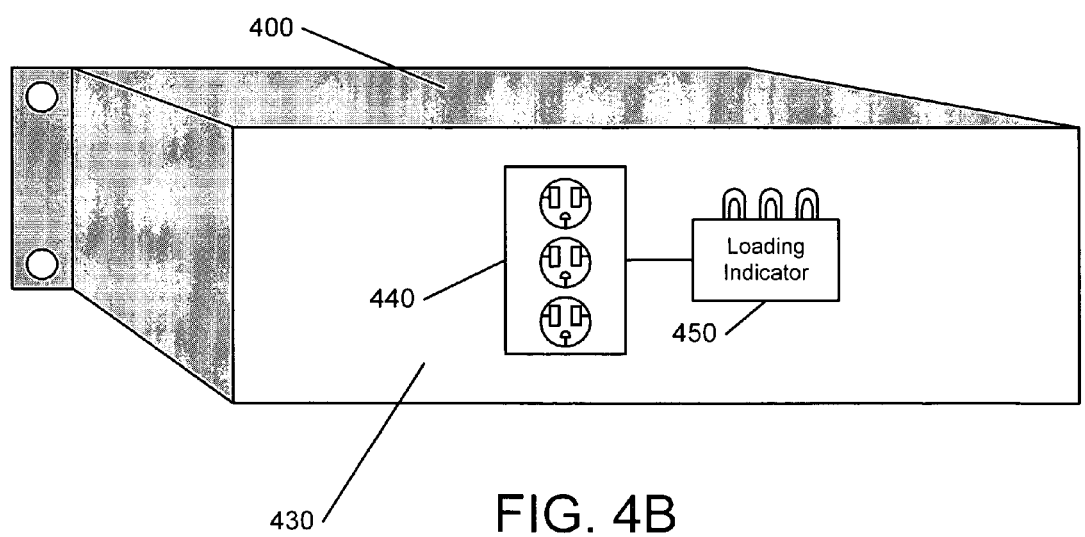
Figure 5:
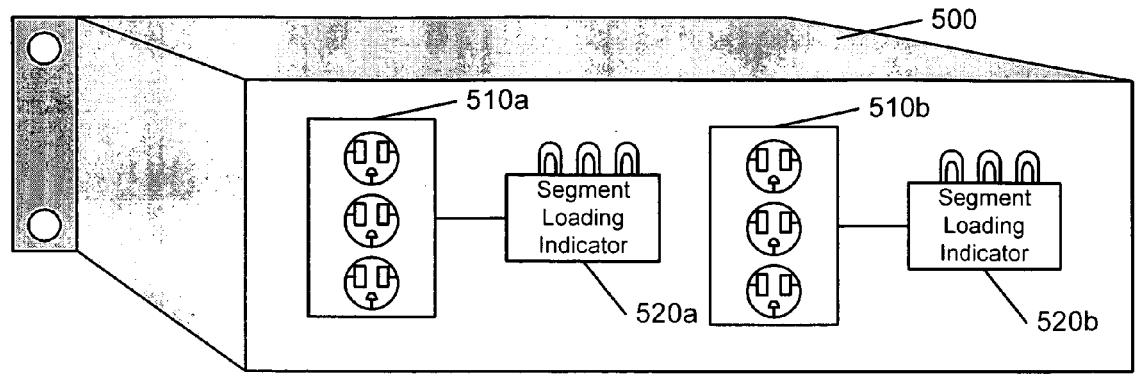

According to further exemplary embodiments of the invention, a rear panel loading indicator may be provided in a power supply device, such as a UPS. For example, as shown in FIG. 4A, a rack-mountable UPS 400 may provide a user interface 420 on a front panel 410 that includes, for example, a pushbutton switch 422 for turning the UPS 400 on and off, a pushbutton switch 424 for silencing an alarm, LEDs 426, 428 for indicating fault and "on battery" conditions, and a plurality of LEDs 429 that are used to indicate loading of the UPS 400. Referring to FIG. 4B, a power output 440 may be provided on a rear panel 430 the UPS 400. According to some embodiments of the invention, the UPS 400 may further include an auxiliary rear panel mounted loading indicator 450 coupled to the power output 440. The presence of such an auxiliary loading indicator 450 may be particularly advantageous when connecting loads to the UPS 400, as it can eliminate the need to refer to the front panel indicator LEDs 429 to determine whether a connection of a new load might undesirably load the UPS 400. As shown in FIG. 5, a UPS 500 that includes multiple rear-panel load segment outputs 510a, 510b may be similarly provided with rear-panel segment loading indicators 520a, 520b for the respective load segment outputs 510a, 510b. Although FIGS. 4A, 4B and 5 illustrate rack-mountable UPSs, it will be appreciated that similar rear-panel loading indicators may be provided in power supplies having other form factors, such as console-type UPSs.

Figure 6:
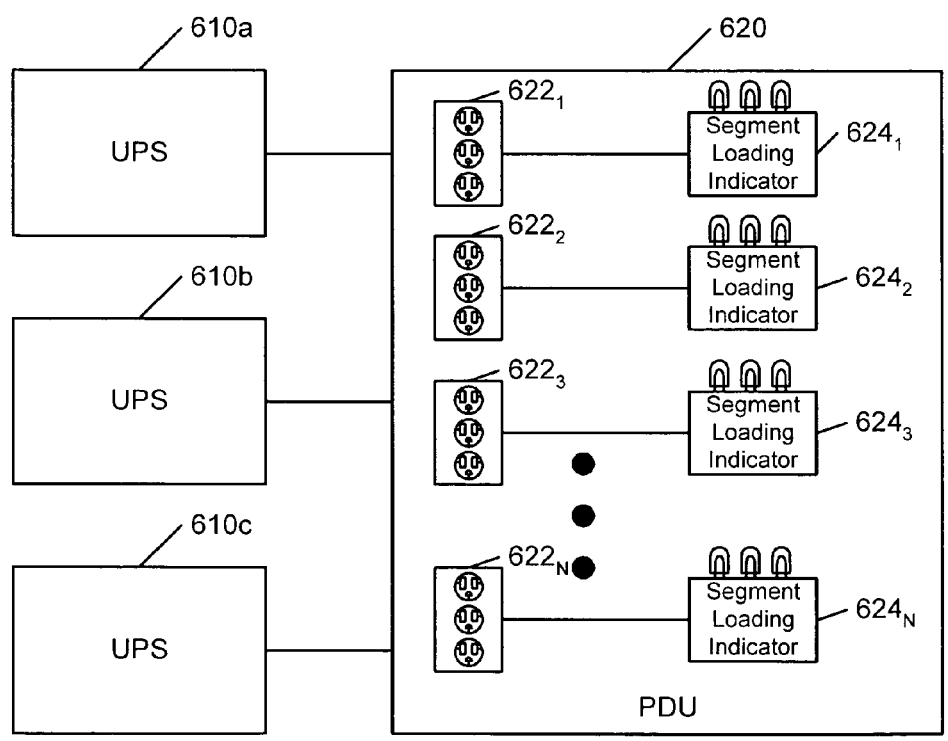
FIGS. 6 and 7 illustrate provision of segment loading indicators in power distribution devices according to additional embodiments of the invention.
Figure 7:
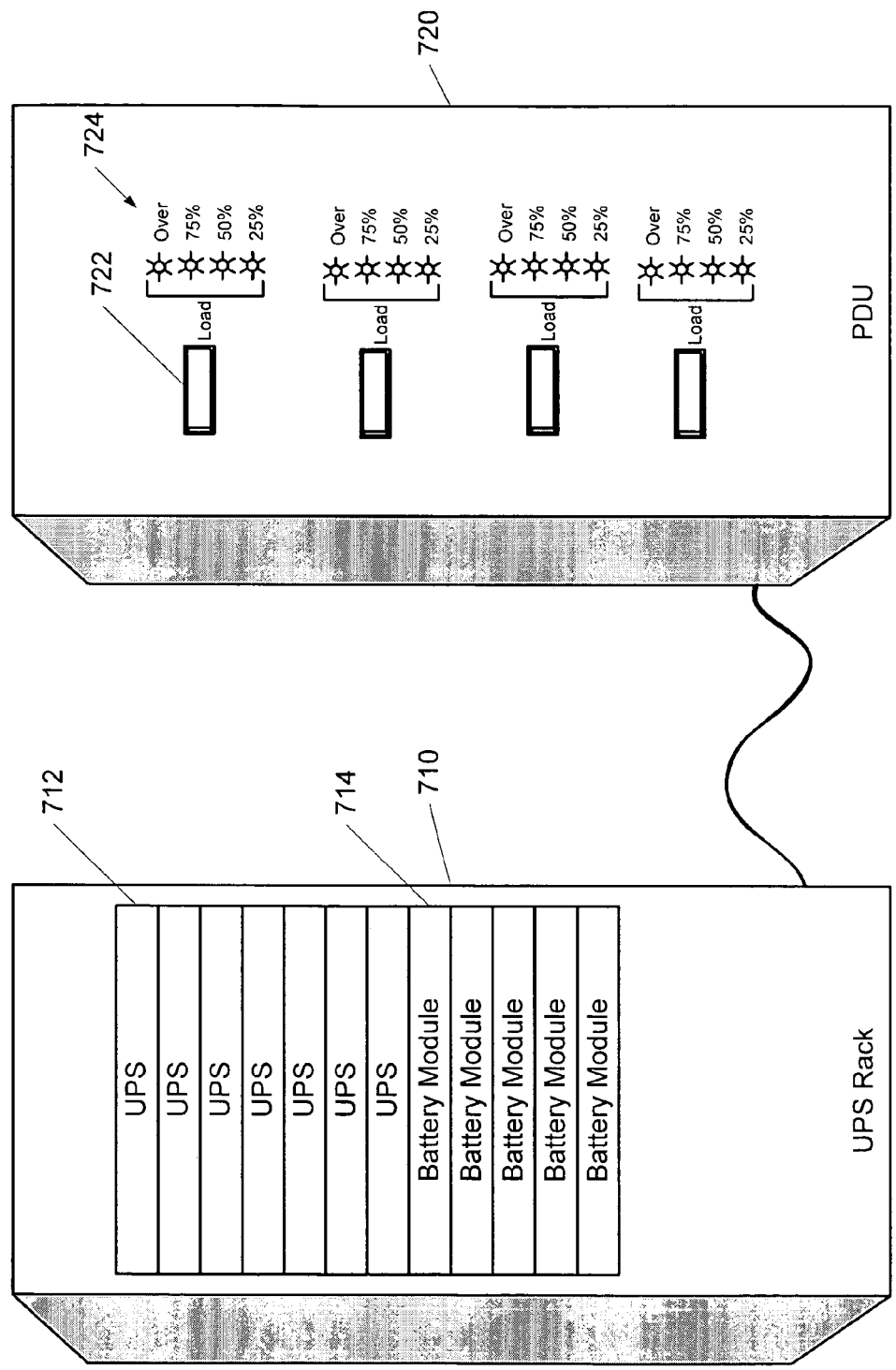
Figure 8:
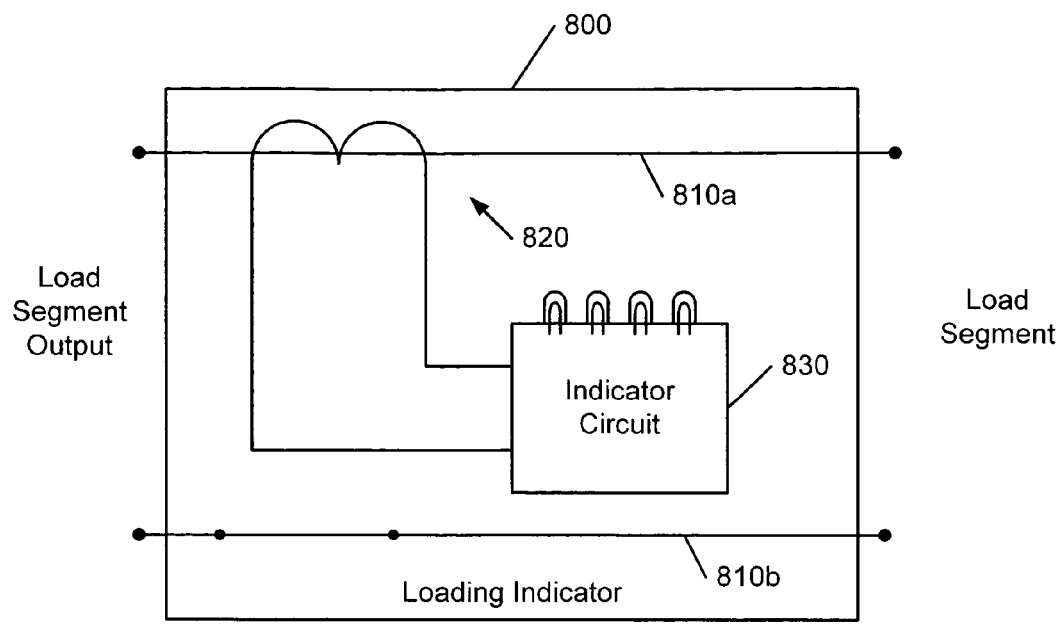
FIGS. 8 and 9 illustrate exemplary loading indicators according to some embodiments of the invention.

FIGS. 6-8 illustrate examples of provision of segment loading indicators in power distribution devices that are coupled to a power supply, such as a UPS. Referring to FIG. 6, a power distribution unit (PDU) 620 receives power from a plurality of UPSs 610a, 610b, 610c, and distributes it to respective load segments via respective load segment outputs $622_1$-$622_N$. The PDU 620 further includes respective segment loading indicators $624_1$-$624_N$ that are coupled to the respective load segment outputs $622_1$-$622_N$ and operative to provide indication of the loading of the respective load segment outputs $622_1$-$622_N$. For example, as shown in FIG. 7, a UPS rack 710 may include a plurality of UPSs 712 and battery modules 714, and may provide power to a PDU 720 including multiple circuit breakers 722 and associated loading indicators 724 for various circuits served by the PDU 720. It will be understood that such load segment indicators 724 may be provided on a rear panel and/or a front panel of the PDU 720.

Figure 9:
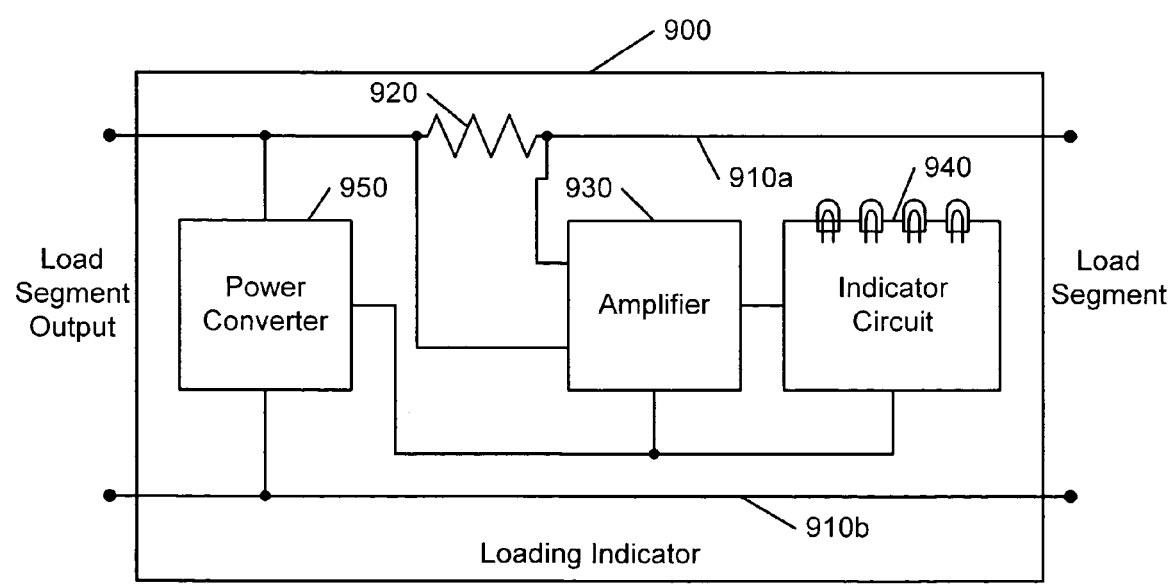

FIGS. 8 and 9 illustrate exemplary load indicators that may be used in embodiments of the invention. Referring to FIG. 8, a loading indicator 800 may include a current transformer 820 configured to sense current in a conductor 810a of a pair of conductors 810a, 810b that couple a load segment output to a load segment. An indicator circuit 830 is coupled to the current transformer 820 and responsively generates an indication of loading of the load segment output, e.g., by illuminating one or more LEDs responsive to a voltage developed by the current transformer 820. Referring to FIG. 9, a load indicator 900 may include an amplifier 930 that amplifies a voltage developed across a shunt resistor 920 coupled in series with a conductor 910a of a pair of conductors 910a, 910b that connect a load segment output to a load segment. An indicator circuit 940 generates an indication of loading of the load segment output responsive to the amplified voltage. A power converter 950 may be coupled to the conductors 910a, 910b to provide a power supply for the amplifier 930 and the indicator circuit 940.

It will be appreciated that the load indicators 800, 900 may be integrated into a power supply (e.g., a UPS), a power distribution device (e.g., a PDU), or similar power distribution device, such as a load panel. In the drawings and specification, there have been disclosed exemplary embodiments of the invention. Although specific terms are employed, they are used in a generic and descriptive sense only and not for purposes of limitation, the scope of the invention being defined by the following claims.

That which is claimed is:

1. An apparatus comprising:
   a plurality of segment loading indicators on a power supply and configured to be electrically coupled to respective load segment outputs of the power supply, each of the segment loading indicators operative to provide an indication of a loading of the associated load segment output of the power supply.

2. An apparatus according to claim 1, wherein at least one of the segment loading indicators is operative to provide an indication of a loading of the associated load segment output with respect to load rating of the associated load segment output.

3. An apparatus according to claim 1, wherein at least one of the segment loading indicators is operative to provide an indication of a loading of the associated load segment output with respect to a load rating of a circuit protection device that protects the associated load segment output.

4. An apparatus according to claim 1, wherein at least one of the segment loading indicators is operative to provide an indication of the loading of the associated load segment output within a rated load range of the associated load segment output.

5. An apparatus according to claim 4, wherein the plurality of segment loading indicators comprises a plurality of segment loading indicators integrated in an uninterruptible power supply (UPS), and wherein respective ones of the segment loading indicators are operative to provide a visual indication of respective loadings of respective load segment outputs of the UPS.

6. An apparatus according to claim 1, wherein at least one of the segment loading indicators is operative to provide a visual indication of the loading of the associated load segment output.

7. An apparatus according to claim 1, wherein the plurality of segment loading indicators are integrated in the power supply.

8. An apparatus according to claim 1, wherein the plurality of segment loading indicators are integrated in a power distribution device configured to be connected to the power supply and including the load segment outputs.

9. An apparatus according to claim 8, wherein the power distribution device comprises one of a power distribution unit (PDU) or load panel.

10. An apparatus according to claim 1, wherein at least one of the segment loading indicators is operative to provide respective visual indications for respective load levels.

11. An apparatus according to claim 10, wherein the at least one of the segment loading indicators is further operative to provide a visual indication of an overload.

12. An apparatus according to claim 10, wherein the at least one of the segment loading indicators is operative to provide respective color displays for respective load levels.

13. An apparatus according to claim 10, wherein the at least one of the segment loading indicators is operative to provide a first visual indication for a first less than fully loaded condition and to provide a second visual indication for a second less than fully loaded condition.

14. An apparatus according to claim 1, wherein at least one of the segment loading indicators comprises:
 a current detector circuit operative to generate a current detector signal representative of current at the associated load segment output; and
 a display circuit operative to generate a visual display responsive to the current detector signal.

15. An apparatus according to claim 14, wherein the current detector circuit comprises a current transformer.

16. An apparatus according to claim 14, wherein the current detector circuit comprises a current sense resistor.

17. An apparatus according to claim 1, wherein at least one of the load segment outputs includes a plurality of power output sockets.

18. An apparatus according to claim 17, wherein each of the load segment outputs includes a plurality of power output sockets.

19. A UPS comprising:
 a housing having first and second panels;
 a power output at the second panel of the housing;
 uninterruptible power supply circuitry supported by the housing and operative to generate a voltage at the power output;
 a user interface positioned at the first panel of the housing and operatively associated with the uninterruptible power supply circuitry; and
 a loading indicator coupled to the power output and operative to provide a visual indication at the second panel of the housing of a loading of the power output, wherein the power output comprises a plurality of load segment outputs, and wherein the loading indicator comprises a plurality of segment loading indicators, respective ones of which are operative to provide respective visual indications of loadings of the respective load segment outputs.

20. A UPS according to claim 19, wherein the loading indicator is operative to provide a visual indication of a loading of the outlet within a rated load range.

21. A UPS according to claim 19, further comprising a protective device that protects the power outlet, and wherein the loading indicator is operative to provide a visual indication of a loading of the power output with respect to a load rating of the protective device.

22. A UPS according to claim 19, wherein the respective visual indications of loadings of the respective load segment outputs are provided with respect to load ratings of the load segment outputs.

23. A UPS according to claim 22, wherein the user interface comprises a load indicator positioned at the front panel of the housing and operative to provide an indication of an aggregate loading of the UPS load segment outputs.

24. A UPS according to claim 19, wherein the loading indicator is operative to provide respective visual indications for respective load levels.

25. A UPS according to claim 24, wherein the loading indicator is operative to provide respective color displays for respective load levels.

26. A UPS according to claim 24, wherein the loading indicator is operative to provide a first visual indication for a less than fully loaded condition and a second visual indication for an overloaded condition.

27. A UPS according to claim 19, wherein the housing comprises a rack-mountable housing.

28. A UPS comprising:
 a plurality of load segment outputs;
 uninterruptible power supply circuitry operative to provide power at the load segment outputs; and
 a housing comprising respective segment loading indicators that are coupled to the respective load segment outputs and are operative to provide respective indications of loadings of the respective load segment outputs.

29. A UPS according to claim 28, wherein the segment loading indicators are operative to provide respective indications of respective loadings of the respective load segments with respect to respective load ratings of the load segment outputs.

30. A UPS according to claim 29, wherein the segment loading indicators are operative to provide respective indications of respective loadings of the respective load segment outputs with respect to respective load ratings of respective circuit protection devices that protect the respective load segment outputs.

31. A UPS according to claim 28, wherein the segment loading indicators are operative to provide respective indications of respective loadings of the respective load segment outputs within respective rated load ranges of the respective load segment outputs.

32. A UPS according to claim 28, wherein the segment loading indicators are operative to provide respective visual indications of respective loadings of the respective load segment outputs.

33. A UPS according to claim 28, wherein the segment loading indicators are operative to provide respective visual indications for respective load levels.

34. A UPS according to claim 33, wherein the segment loading indicator is operative to provide respective color displays for respective load levels.

35. A method of operating a UPS having a rear panel output and a front panel user interface, the method comprising:

providing a visual loading indication for the output on the rear panel, wherein the UPS has a plurality of load segment outputs, and wherein providing a loading indication comprises providing respective loading indications for the respective load segment outputs.

* * * * *